(12) United States Patent
Kubacki

(10) Patent No.: US 7,026,102 B2
(45) Date of Patent: *Apr. 11, 2006

(54) PLASMA DEPOSITED SELECTIVE WETTING MATERIAL

(76) Inventor: Ronald M. Kubacki, 3514 Rollingside Dr., San Jose, CA (US) 95148

(*) Notice: Subject to any disclaimer, the term of this patent is extended or adjusted under 35 U.S.C. 154(b) by 0 days.

This patent is subject to a terminal disclaimer.

(21) Appl. No.: 10/831,442

(22) Filed: Apr. 24, 2004

(65) Prior Publication Data

US 2004/0197488 A1 Oct. 7, 2004

Related U.S. Application Data

(60) Division of application No. 10/045,314, filed on Jan. 14, 2002, now Pat. No. 6,764,812, which is a continuation-in-part of application No. 09/435,396, filed on Nov. 6, 1999, now Pat. No. 6,416,938, which is a continuation-in-part of application No. 08/873,513, filed on Jun. 12, 1997, now abandoned.

(60) Provisional application No. 60/020,392, filed on Jun. 25, 1996.

(51) Int. Cl.
   *G03F 7/00* (2006.01)
   *G03F 9/00* (2006.01)

(52) U.S. Cl. .......................................... 430/324; 430/5

(58) Field of Classification Search .................. 430/5, 430/313, 314, 315, 322, 324
   See application file for complete search history.

(56) References Cited

U.S. PATENT DOCUMENTS

| | | | | |
|---|---|---|---|---|
| 4,532,150 A | * | 7/1985 | Endo et al. | 427/577 |
| 4,921,321 A | * | 5/1990 | Weidman | 385/130 |
| 5,500,250 A | * | 3/1996 | Ogawa et al. | 427/299 |

\* cited by examiner

*Primary Examiner*—Nicole Barreca

(57) ABSTRACT

A selective wetting material is formed by plasma depositing a film on a substrate from a two-component reaction of a silicon donor and organic precursor, and photo-oxidizing selected regions of the deposited film to form wetting regions to which a liquid will selectively adhere. When the liquid is an electrically conductive material, the process may be used to form printed circuits on a circuit board. When the substrate is optically transparent and the non-photo-oxidized regions of the film are removed, the process may be used to form a photomask.

25 Claims, No Drawings

PLASMA DEPOSITED SELECTIVE WETTING MATERIAL

CROSS REFERENCE TO RELATED APPLICATIONS

This application is a division of U.S. application Ser. No. 10/045,314, filed Jan. 14, 2002 now U.S. Pat. No. 6,764,812, which is a continuation-in-part of U.S. application Ser. No. 09/435,396, filed Nov. 6, 1999, now U.S. Pat. No. 6,416, 938, which is a continuation-in-part of U.S. application Ser. No. 08/873,513, filed Jun. 12, 1997, now abandoned, which claims the benefit of U.S. Provisional Application No. 60/020,392, filed Jun. 25, 1996, each of which is incorporated herein by reference in its entirety.

FIELD OF THE INVENTION

The invention relates generally to the formation of photosensitive organosilicon films by plasma-initiated polymerization utilizing direct application of electrical energy, and more particularly, to the formation of photosensitive films from a silicon donor and an organic precursor for use as a selective wetting material.

BACKGROUND OF THE INVENTION

Selective wetting materials can be used in applications associated with the fabrication of electrical circuits.

An integrated circuit is a three-dimensional structure of alternating patterned layers of conductors, dielectrics and semiconductor films. The patterned layers are formed by lithographic processes that consist of two steps: delineation of the patterns in a radiation sensitive material, usually a polymer; and transfer of the patterns into underlying, previously deposited thin films, using an appropriate etching technique.

Conventional photolithography (that is, photolithography employing light at 350 to 450 nm wavelength) is used to fabricate solid-state devices with features of 6 µm or smaller. Incremental improvements have allowed the use of light in the range of 350 to 450 nm wavelength to produce ever smaller features. However, the ultimate resolution of a printing technique is governed, at the extreme, by the wavelength of the light, or radiation, used to form the image, with shorter wavelengths yielding higher resolution. The same physical principles also govern the resolution limits in microscopy. Additionally, the same basic positive photoresist, consisting of a photoactive compound that belongs to the diazonaphthoquinone chemical family and a novolac resin, has been in pervasive use since the mid-nineteen seventies, and will likely be the resist of choice for several more years. The manufacturing facility has also been driven to cleaner specifications due to the smaller geometries of the parts being produced. The cost of introducing a new photolithographic technology, which includes the cost associated with the development and implementation of new hardware and resist materials, is a strong force pushing refinement of current photolithographic processes and conventional clean room design instead of pursuing revolutionary techniques. The technological alternatives to conventional photolithography are largely the same as they were a decade ago: short wavelengths of light (220 to 280 nm), the so-called deep ultraviolet range photolithography; scanning or projection electron beam; and x-ray or scanning ion beam lithography.

Unfortunately, conventional resists are not appropriate for use with the new lithographic technologies that are necessary for producing line widths under 0.5 µm. The most notable deficiencies of the conventional novolac-quinonediazide resists are their sensitivity and absorption characteristics. Additionally, the absorption of conventional photoresists is too high to allow uniform imaging through practical resist film thicknesses (approximately equal to 1 µm). Thus, no matter which technology becomes dominant after photolithography has reached its resolution limit (that is, 0.3 to 0.5 µm), new resists and processes will be required, necessitating enormous investments in research and process development. The introduction of new resist materials and processes will also require a considerable lead time to bring them to the performance level currently realized by conventional positive photoresists. Clearly, conventional wet chemistry photoresists have limited applicability for the future of solid-state device fabrication. Liquid resist chemicals are very difficult to obtain in a pure state and are expensive. The process of applying a wet resist does not lend itself to large or odd shaped substrates, and the required baking step makes this process unsuitable for temperature sensitive substrates.

Consequently, there are advantages to a photoresist which is easily applied and processed in a vacuum chamber or series of enclosed chambers with no requirement for being brought to atmosphere. Such a photoresist permits the elimination of wet chemistry processes, and consequently, provides substantial benefits in the reduction of costs and generation of hazardous wastes. Furthermore, it eliminates the exposure of operators to the hazardous liquids and vapors generated by the conventional resist process. Finally, the dry plasma deposited photoresist allows the further development of integrated manufacturing modules without the necessity of clean rooms.

Despite intensive research on the plasma deposition of amorphous silicon from monosilane ($SiH_4$), there have been only a few reports exploring the formation of Si—Si bonded polymers from monosubstituted organosilanes. Haller reported an example of selective dehydrogenative polymerization, but no photochemical studies were described. See Haller, *Journal of the Electrochemical Society A*, Vol. 129, 1987, p.180, and Inagaki and Hirao, *Journal of Polymer Science A*, Vol. 24, 1986, p. 595. Studies on the plasma chemistry of methylsilane ($MeSiH_3$) have involved higher radio-frequency powers and temperatures which promote formation of amorphous silicon carbide (SiC) rather than reactive polymeric product. See Delpancke, Powers, Vandertop and Somorjai, *Thin Solid Films*, Vol. 202, 1991, p. 289. Low power plasma polymerization of tetramethylsilane and related precursors has been proposed to result in the formation of Si—C—Si linkages. See Wrobei and Wertneimer, *Plasma Deposition, Treatment and Etching of Polymers*, Academic Press, New York, Chapter 3. Such materials lack sufficient absorption in light above approximately 225 nm wavelength, but have been studied as far ultraviolet (193 nm wavelength) resists by Horn and associates. See Hom, Pang and Rothschild, *Journal of Vacuum Science Technology B*, Vol. 8, 1991, p. 1493. Polymer chemistry teaches the use of the basic silanes are insignificant as a monomer for polymerization type of polymer. Furthermore, polysiloxanes are differentiated from the basic silanes, and contrasted as being very important in terms of monomers for polymerization. See Stevens, Malcom P., *Polymer Chemistry, An Introduction*, Addison-Wesley Publishing Co., 1975: p. 334. As used herein, polymerization is the process whereby monomers are bound together forming various length chains but essentially repeating the basic building block of the monomer without significant chemical or physical alteration of the beginning monomer.

Work has been reported on the synthesis of soluble poly-alkylsilyne network polymers ($[SiR]_n$) which exhibit intense ultraviolet absorption (associated with extended Si—Si bonding) and may be photo-oxidatively patterned to give stable siloxane networks. See Bianconi and Weidman, *Journal of the American Chemical Society*, Vol. 110, 1988, p. 2341. Dry development is accomplished by selective anisotropic removal of unexposed material by chlorine or hydrobromic acid reactive ion etching. See Hornak, Weidman and Kwock, *Journal of Applied Physics*, Vol. 67,1990, p. 2235, and Horn, Pang and Rothschild, *Journal of Vacuum Science Technology B*, Vol. 8, 1991, p. 1493. The exposed, oxidized material may be removed by either wet or dry fluorine based chemistry. Kunz and associates have shown that this makes polysilynes particularly effective as 193 nm wavelength photoresists. See Kunz, Bianconi, Horn, Paladugu, Shaver, Smith, and Freed, *Proceedings of the Society of Photo-optical and Instrumentation Engineers*, Vol.218, 1991, p. 1466. The high absorbability and the wavelength limits photo-oxidation to the surface, eliminating reflection, and the pattern is transferred through the remainder of the film during the reactive ion etch (RIE) development. Studies of organosilicon hydride network materials containing reactive R—Si—H moieties have found that such high silicon compositions as $[MeSiH_{0.5}]_n$ exhibit superior photosensitivity and function as single layer photodefinable glass etch masks. See Weidman and Joshi, *New Photodefinable Glass Etch Masks for Entirely Dry Photolithography: Plasma Deposited Organosilicon Hydride Polymers*, Applied Physics Letters, Vol. 62, No. 4, 1993, p. 372. However, cost and availability of the exotic organosilicon feedstocks have significantly inhibited the transfer of such photosensitive organosilicon hydride network materials into microcircuit fabrication. Further, films deposited from single component organosilicon feedstocks possess limited latitude in alteration of deposited film characteristics, such as the radiation frequency of photosensitivity and selectivity during etch processes.

Organosilicons have been used to produce various types of films, as disclosed by the following references.

| U.S. Pat. No. | Name | Date |
| --- | --- | --- |
| 4,493,855 | Sachdev et al. | January 1985 |
| 4,532,150 | Endo, et al. | July 1985 |
| 4,868,096 | Nakayama et al. | September 1989 |
| 5,294,464 | Geisler et al. | March 1994 |

Sachdev et al. teaches the deposition of an organosilicon film by plasma polymerizations. However, the deposited film is not itself photosensitive. Sachdev et al. uses the film as a barrier and uses a conventional spun-on resist to pattern it. Sachdev et al. does not teach the use of a plasma-deposited film as a photoresist; a conventional photoresist is used to pattern the plasma-deposited film, which is then used as an etch mask. Endo et al. describes the plasma deposition of a silicon carbide layer. A single organosilicon gas that may react with other materials is used to deposit a durable silicon carbide type of film. Furthermore, Endo et al. does not teach film photosensitivity. Nakayama et al. discloses the use of an oxygen plasma to modify a silicon surface to allow a conventional photoresist to adhere to the material. The conventional photoresist is then used to pattern the silicon layer. A photosensitive organosilicon film is not deposited. There is no plasma depositing of a film; the oxygen plasma is used to modify the surface structure which is followed with conventional techniques for patterning the silicon film. Geisler et al. describes a method of plasma-coating a plastic substrate using organosiloxanes and an inert gas to facilitate adhesion of a reflective layer of a metal with minimal surface damage to the substrate. None of these references teach a selective wetting material formed from a photosensitive plasma polymerized organosilicon film produced from a two-component plasma reaction wherein the first component comprises a silicon donor that is non-carbon containing and non-oxygenated and the second component comprises an organic precursor that is non-silicon containing and non-oxygenated, with selective regions of the film being photo-oxidized to produce a selective wetting material that when brought in contact with a liquid, the liquid will selectively wet and adhere to the photo-oxidized regions of the film, and will not adhere to the non-photo-oxidized regions of the film.

A conventional circuit board is produced by depositing an electrically conductive material, such as silver, on the surface of a substrate (or circuit board) formed from an electrically insulated material, such as a glass epoxy laminate. Selected regions of the deposited electrically conductive material are removed by etching in a patterning process that can be accomplished by photolithography. The remaining regions of electrically conductive material form the printed conductors on the circuit board. The process is inefficient in that the entire surface of the board is first coated with the electrically conductive material, and then some of the deposited material must be removed to define the printed circuit paths or conductors on the board. Therefore there is the need for a process that can form printed circuits on the board without first blanket coating of the board with the electrically conductive material and then selectively removing regions of the electrically conductive material.

BRIEF SUMMARY OF THE INVENTION

One aspect of the present invention is a process for forming a plasma-deposited selective wetting material on a substrate by forming a photosensitive film on a substrate from a two-component plasma reaction. The first component comprises a non-carbon containing and non-oxygenated silicon donor and the second component comprises a non-silicon containing and non-oxygenated organic precursor. The film is patterned with radiated electromagnetic energy through a mask in the presence of oxygen to produce a selective wetting material that has one or more photo-oxidized regions. When the selective wetting material is placed in contact with a liquid, the liquid selectively wets and adheres to the photo-oxidized regions and does not adhere to the non-photo-oxidized regions.

When the liquid is an electrically conductive material, the deposition and drying of the liquid adhering to the photo-oxidized regions can form printed circuits on a circuit board.

When the non-photo-oxidized regions of the selective wetting material are removed and the substrate is an optically transparent material, the substrate with the remaining photo-oxidized regions covered by the deposited and dried liquid can form a photomask.

Additional objects, advantages and other useful features of the invention will become apparent to those skilled in this art from the following description, wherein a preferred embodiment of this invention is shown and described, simply by way of illustration of one of the modes best suited to carrying out the invention. As will be realized, the invention is capable of other and different embodiments, and its several details are capable of modifications in various, obvious aspects, all without departing from the invention. Accordingly, the description is to be regarded as illustrative in nature, and not restrictive. The objects and advantages of the invention may be realized and attained by means of the processes particularly pointed out and claimed in the appended claims.

DETAILED DESCRIPTION OF THE INVENTION

Plasma-deposited photosensitive polymer (PDPP) films used to produce selective wetting materials of the present invention are produced by flowing a silicon donor and an organic precursor into an evacuated plasma chamber, wherein the donor and precursor react and deposit a PDPP film on a substrate in the chamber. Any plasma chamber with the following characteristics would be suitable for the development of these films:

(1) hardware for evacuating the chamber to eliminate the presence of oxygen;

(2) electrodes supplied with electrical energy to sustain the plasma;

(3) hardware for flowing the silicon donor and organic precursor through the plasma chamber at controlled flow pressures; and (4) hardware for holding the substrate on which the film is to be deposited in position in the plasma chamber.

For the deposition of these particular films, a Model DSN Room Temperature Plasma Deposition System, which is available from Ionic Systems (San Jose, Calif.), was used. This plasma chamber is substantially as disclosed in U.S. Pat. No. 4,262,631, with modifications noted herein. The plasma chamber was equipped with dual power supplies of 2,500 W and 1,000 W that operated at 13.56 MHz. The plasma chamber was vacuum pumped with an Edwards High Vacuum International (Wilmington, Mass.) Model E2M-80 direct drive rotary vane pump. Flow pressures were monitored with an M K S Instruments, Inc. (Andover, Mass.) Series 220 BARATRON.

The materials used as silicon donor and organic precursor must be in a gaseous or vapor state to achieve flow through the plasma chamber. Selection of materials for the silicon donor and organic precursor will be dependent upon the desired characteristics of the PDPP film, the cost of the materials, and how well-behaved the materials are in the processing environment.

The material used as a silicon donor is a substantially non-carbon containing and non-oxygenated silicon compound. Silicon hydrides are preferred since they provide more silicon, which enhances the use of the PDPP film as a resist in the fabrication of solid-state devices and other film product applications, such as selective wetting materials. In one preferred embodiment of the invention, monosilane ($SiH_4$) is used as the silicon donor. Other suitable source materials for silicon donors include disilane ($Si_2H_6$) and dichlorosilane ($SiH_2Cl_2$).

The material used as an organic precursor is a substantially non-silicon containing and non-oxygenated organic compound. In these preferred embodiments, ethylene ($C_2H_4$), methane ($CH_4$) and ethane ($C_2H_6$) are used as gaseous organic precursors, and toluene ($C_6H_5CH_3$) is used as a liquid vapor donor. Other suitable sources for organic precursors broadly include organic compounds such as alkanes, alkenes, alkynes, phenyls and aromatic hydrocarbons. Selective organic compounds may be blended to achieve an optimum organic precursor for a desired PDPP filming process.

A film formed from a separate silicon donor and organic precursor leads to a film product that is more easily produced and controlled in its content than film product from a single organosilicon feedstock.

In one preferred embodiment, monosilane is used as the silicon donor, and ethylene gas or toluene vapor is used as an organic precursor to deposit the PDPP film. Flow rates of monosilane have been used in the range of 20 to 200 scc/min (preferably 25 to 35 scc/min), and organic precursors flowed at 100 to 300 scc/min (preferably 140 to 180 scc/min). Pressure in the plasma chamber has been allowed to build to 150 to 500 mtorr (preferably in the range of 180 to 300 mtorr). Power for deposition of the film has been applied in densities from 0.8 to 15 mW/cc, with the optimum range being 8 to 10 mW/cc at 13.56 MHz. These operating parameters will be understood by those skilled in the art as typical operating conditions and not as limiting the scope of the invention.

The monosilane used was Semiconductor Grade Silane ($SiH_4$), which is available from Liquid Carbonic Industries Corp. (Oak Brook, Ill.). Organic precursors were 99.9% pure ethylene, supplied by Liquid Carbonic Industries Corp., or ACS Certified Class 1B toluene, supplied by Fisher Chemicals (Fair Lawn, N.J.).

Selected organic precursor materials must have sufficient vapor pressure, with or without heating, to allow their introduction into the plasma chamber. This includes a variety of materials that can be either a gas or liquid at standard temperature and pressure (STP). In most cases, the exposure of a liquid organic precursor in a containment vessel to the vacuum system will generate sufficient vapor flow to allow many liquids, as well as gases, to be used with no operator exposure. If sufficient vapor pressure is not attained, the liquid donor may be heated slightly to increase its vapor pressure. For the processing of the films in one preferred embodiment, one gas at STP, ethylene, or one liquid at STP, toluene, is used as the organic precursor. Toluene was selected due to its favorable vapor pressure, as well as its ultraviolet transmission characteristics. Neither the silicon donor nor the organic precursor can contain an appreciable amount of oxygen, since oxygen with ultraviolet exposure from the plasma during the deposition process would cause photo-oxidation of the silicon and degrade the photosensitivity of the deposited film.

A silicon donor that is substantially non-carbon and non-oxygen containing inhibits the polymerization of the silicon donor with the organic precursor during the plasma reaction. This promotes the encasing of plasma-generated modified forms of the silicon donor that include (Si—H) and (Si—Si) low molecular weight fragments within an organic polymer matrix formed substantially from plasma-polymerization of the organic precursor. Therefore, photo-oxidation is achieved primarily by the oxidation of the silicon within the interstitially situated modified forms of the silicon donor when the film is subjected to radiated electromagnetic energy.

For the monosilane/ethylene film depositions, ethylene was supplied to an inlet port on the plasma chamber and controlled with a manual flow valve. A vessel was used for the containment of liquid toluene for the monosilane/toluene film depositions. The liquid nature of toluene at STP required the development of a method for the introduction of toluene vapors to the plasma chamber. A sample cylinder was obtained and thoroughly cleaned for the toluene introduction. After cleaning and drying, the cylinder was attached to the deposition system and evacuated to less that 10 mtorr. At this point, the valve on the sample cylinder was closed and the cylinder removed from the system. A clean stainless steel tube was attached to the sample cylinder. The tube was submerged in a vessel of reagent grade toluene and the shut-off valve was opened. The vacuum inside the sample cylinder was used to draw the toluene into the sample cylinder while introducing as little trapped gas as possible. After installation on the vacuum system, the shut-off valve was opened and the toluene was allowed to degas for fifteen minutes before any plasma processing was attempted. Seasoning runs were performed for one hour before actual depositions were performed for the photosensitive films.

A water bath was installed on the liquid toluene vapor source to assist in keeping a constant vapor pressure during the depositions. No heating was used in the bath, but the temperature held at 23° C.±1° C. during depositions. Pressure during depositions held constant within ±5 mtorr. The effect of the evaporative cooling was minimal on the vapor pressure and flow of the liquid toluene donor. Flow from the vessel was controlled with a manually adjusted valve on the top of the containment vessel. Initially, no attempt was made to either heat or hold the liquid vessel isothermal to reduce evaporative cooling, which would have an impact on the ability to maintain constant flow. However, pressure during deposition was constantly monitored to determine if the flow of the toluene was dropping.

Initial depositions of the PDPP films were performed with the plasma chamber's depositor under manual control to easily vary and control deposition conditions. A monosilane flow rate of 50 scc/min was used to establish a plasma chamber pressure with the monosilane, and then varying amounts of organic precursors were flowed to achieve the desired pressure increases. The ratio of the pressure of the organic precursor to the pressure of the monosilane was used for monitoring during the screening. Weight ratios of organic precursor to monosilane of less than 1:4 and greater than 2.5:1 resulted in films of negligible photosensitivity. For useful depositions, weight ratios of organic precursor to monosilane of 1:2 and 1:1 were chosen. In addition, for deposition, input power to the plasma chamber was varied between 200 W and 400 W. PDPP films were successfully deposited on a variety of organic and inorganic substrates with the disclosed process. Magnetic substrates, either as a top deposition layer or other layer in the composite substrate, are not a preferred application since the magnetic field produced by the material, even if it is not the contact layer for the film, has the potential of interfering with the structure of the film during the plasma polymerization process and thereby can influence the photosensitivity throughout the thickness of the film.

It is preferable to separately flow the silicon donor and organic precursor into the plasma chamber to enhance substantial uniformity of the plasma-modified silicon donors within the resulting organic polymer matrix and prevent possible spontaneous pre-reactions. As understood by those skilled in the art, silicon donors and organic precursors can be premixed in a variety of ratios to ensure uniform component distribution, and reduce the cost and complexity of the piping and associated hardware for gas introduction into the plasma chamber. Donors and precursors can also be premixed or mixed in a manifold. Premixing of the silicon donor and organic precursor is acceptable but may require stricter process control to achieve a substantially uniform distribution within the film. Hydrogen or an inert gas may be added to increase uniformity due to its higher mobility.

As understood by those skilled in the art, a variety of deposition systems may be used that operate at a wide variety of power levels and types, including radio frequency range (approximately 40 kHz) through microwave, and electron cyclotron resonance systems operating in excess of 2 GHz. In the preferred embodiments, there is no substrate heating involved, but the substrate can be heated or cooled during the deposition process to enhance the properties of the deposited films. A wide variety of pressures, from ultrahigh vacuum (less than $10^{-7}$ torr) up to and exceeding atmospheric pressure can be used. In the preferred plasma chamber, the substrate floats electrically, but it can be grounded or powered.

Samples of the PDPP films that were prepared by the above processes were exposed to ultraviolet radiation in the presence of oxygen from the air. Exposures were performed at low resolution using UVP, Inc. (Upland, Calif.) Model No. UVG-54 ultraviolet source for use at 254 nm wavelength. Exposures at 365 nm wavelength were made using the same lamp housing with a UVP, Inc. Model No. 34-0034-01 ultraviolet source for use at 365 nm wavelength. Various masks were used for contact type imaging.

Developing was performed in a 10:1 Buffered Oxide Etch (10:1 BOE) supplied by Ashland Chemical Company (Columbus, Ohio). A composition for this 10:1 Buffered Oxide Etch can be found in Ashland Chemical Company's Material Safety Data Sheet No. 308.0034306-005.004I, which defines the ingredients of the 10:1 BOE in percent by weight as: water (57.0 -61.0%); ammonium fluoride (34.0-38.0 %); and hydrofluoric acid (4.7%). Film thicknesses were determined profilometrically with a Sloan Technology Corp. (Santa Barbara, Calif.) Dektak 1 and Nanometrics Inc. (Kanata, ON, Canada) Model 216S.

Photosensitivities were first observed after exposure to 254 nm wavelength deep ultraviolet with a simple contact mask. Development took place in a 10:1 BOE to establish that there was conversion of the plasma-deposited photosensitive polymer (PDPP) to the exposed glass-like plasma-deposited photosensitive polymer (GLPDPP), and to establish etch rates.

The films deposited by the above disclosed processes had thicknesses of 0.08 to 0.15 μm of PDPP. These film thicknesses are representative of achievable film thicknesses and are not limiting as to the scope of the invention. Development was performed in a 10:1 BOE. Except as noted in Table 1, there was selectivity exhibited between PDPP and GLPDPP, and the GLPDPP was entirely removed from the silicon substrate as indicated by profilometry.

TABLE 1

Data for PDPP Deposition, Photo-oxidation and Etching

| Sample Number | Organic Precursor | Partial Pressure of the Organic Precursor Relative to Silane (%) | Power (W) | Deposition Rate (Å/sec) | Resultant Compressive Stress in Film (Dynes/cm$^2$) | BOE Etch Rate (Å/min) | Selectivity (GLPDPP: PDPP) |
|---|---|---|---|---|---|---|---|
| 1 | Ethylene | 50 | 400 | 0.82 | $2.7 \times 10^8$ | 140 | Not Detected |
| 2 | Ethylene | 50 | 200 | 0.71 | $8.3 \times 10^7$ | 210 | Not Detected |
| 3 | Ethylene | 100 | 400 | 0.91 | $4.7 \times 10^8$ | 185 | Not Detected |
| 4 | Ethylene | 100 | 200 | 0.72 | $0.8 \times 10^8$ | 320 | >25:1 |
| 5 | Toluene | 50 | 400 | 0.85 | $3.3 \times 10^8$ | 300 | >25:1 |
| 6 | Toluene | 50 | 200 | 0.83 | $7.6 \times 10^7$ | 330 | >25:1 |
| 7 | Toluene | 100 | 400 | 0.88 | $2.1 \times 10^8$ | 285 | >25:1 |
| 8 | Toluene | 100 | 200 | 0.88 | $9.8 \times 10^7$ | 270 | >25:1 |

For the results in Table 1, the monosilane flow rate for all depositions was 50.0 scc/min and the pressure from monosilane flow was 68 to 70 mtorr. Stress measurements were made on bare 1,0,0 silicon wafers. All exposures were made with light at 248 nm wavelength for exposure dosage of 600 mj/sq-cm. Deposited film thickness was 1500 Å. Etch rates are for a 10:1 buffered oxide etch and are for the exposed (GLPDPP) area. Samples were monitored visually every minute during etching to determine etch rate. Samples with greater than 25:1 selectivity (GLPDPP:PDPP etching selectivity) exhibited no PDPP etching from the 10:1 BOE, and actually increased slightly in thickness due to swelling.

For Sample Numbers 1, 2 and 3 in Table 1, the etch selectivity is poor. The etch would not fully clear oxidized areas, and unexposed areas were etching away almost as quickly as the exposed areas. For these samples, a combination of the deposition conditions, exposure conditions, and etchant used resulted in generally unsuitable structures. For samples with good selectivity, film fully converted to GLPDPP.

The use of the 10:1 BOE provides a benchmark for the etchability of the exposed material and further demonstrates that the exposed GLPDPP acts like a silicon oxide type material, while the unexposed PDPP was not affected by the 10:1 BOE, as is consistent with a silicon hydride network.

For use of the film of the present invention as a selective wetting material, selective etching of unexposed, non-photo-oxidized PDPP film is desirable in some applications as further described below. A simple chlorine based dry etch was used to remove unexposed PDPP while leaving the exposed GLPDPP material. Operating conditions for the Zylin etching machine are identified in Table 2. Etching was performed with chlorine plasma dry etching, available from Liquid Carbonic Industries Corp. (Oak Brook, Ill.). Results of the tests are listed in Table 3. Film thicknesses were obtained using a Nanometrics (Kanata, ON, Canada) NANOSTEP. The apparent slight increase in film thickness after etching the unexposed areas is due to normal instrumental error. As can be seen by the results in Table 3, the selectivity in chlorine etch for unexpossed PDPP to exposed GLPDPP is greater than 15 to 1.

TABLE 2

Operating Conditions for Chlorine Etching

| Parameter | Setting |
|---|---|
| Chamber Pressure | 100 mtorr |
| RF Power | 150 W |
| DC Bias | 150 V |
| Chlorine Flow Rate | 50 scc/min |
| Electrode Temperature | 40° C. |

TABLE 3

Results of Chlorine Etching for PDPP/GLPDPP Film

| Sample Number | Exposed Photo-sensitive Polymer (GLPDPP) | Unexposed Photo-sensitive Polymer (PDPP) | Film Thickness Before Etch (Å) | Film Thickness After Etch (Å) | Etch Rate (Å/min) |
|---|---|---|---|---|---|
| 1 | GLPDPP | — | 1712 | 1361 | 351 |
| 1 | — | PDPP | 1825 | 1836 | 0 |
| 2 | GLPDPP | — | 1724 | 1406 | 318 |
| 2 | — | PDPP | 1865 | 1871 | 0 |
| 3 | GLPDPP | — | 1699 | 1327 | 372 |
| 3 | — | PDPP | 1812 | 1819 | 0 |

The above photo-oxidation and selective etching processes show how the PDPP film depositions from separate silicon and organic precursors can be used as a resist material in the fabrication process for solid-state devices and as a selective wetting material in applications wherein the non-photo-oxidized regions of the film are removed. Table 4 illustrates achieved etching selectivites between unexposed PDPP and exposed GLPDPP with various etching processes.

TABLE 4

Selective Etching of PDPP and GLPDPP Material

| Material Etched | Material Not Etched | Etch Selectivity (Material Etched: Material Not Etched) | Etching Process |
|---|---|---|---|
| GLPDPP | PDPP | >50:1 | 10:1 Buffered Oxide |
| GLPDPP | PDPP | >15:1 | Fluorine Reactive Ion |
| PDPP | GLPDPP | >50:1 | Chlorine Reactive Ion |

Photo-oxidation as used in this specification is generally understood to be accomplished by the exposure of a material to radiated electromagnetic energy in the presence of oxygen in air. Generally, light energy is used, and more specifically, light in the ultraviolet end of the visible electromagnetic spectrum, typically recognized as from 200 nm to 400 nm, is used. It will be understood by those skilled in the art that other forms of radiant energy, above visible light in the electromagnetic spectrum, such as x-rays, or gamma or alpha radiation, may be used. Furthermore, since oxygen in the air is the agent for oxidation, other concentrations of oxygen can be used.

In the fabrication of a solid-state device, whether it is a microprocessor, memory chip, liquid crystal display, pressure sensor, transistor, capacitor, resistor, and so forth, the production sequences include the patterning of numerous substrate materials. Patterning is typically done by masking a substrate covered by a film of resist and exposing the resist to radiated electromagnetic energy, typically ultraviolet light, through the mask. As further described below, the selective wetting material of the present invention may be used to fabricate the photomask. The mask permits only selected areas of the resist to be exposed to the ultraviolet light. Then, either the exposed or unexposed resist is selectively etched away in a process knows as developing. One or more production processes, known to those skilled in the art (see, e.g., *Semiconductor and Integrated Circuit Fabrication Techniques*, Gise, Peter, and Blanchard, Richard, Fairchild Corporation, Reston Publishing Company, Reston, Va., 1979), such as: etching of the substrate; pattern or image transfer from the mask to the resist, and then to the substrate; diffusion of a material into a substrate layer; ion implanting in a substrate layer; pigment injection or dyeing of a substrate layer, is then performed. Subsequently, the remaining resist is removed, and the process is repeated as required to fabricate the device. The art of microlithography with conventional chemistries is well known in the art. For a typical silicon based integrated circuit, a silicon dioxide film, or substrate, is grown on a silicon wafer to act as an insulator. Using the disclosed filming process, a PDPP film is deposited on the silicon dioxide. Areas of the silicon dioxide that are to be removed for implant of material into the silicon are patterned. The PDPP is exposed to ultraviolet light through a mask which delineates the required patterning. Using a fluorine reactive ion etch, the GLPDPP produced by exposing the PDPP to ultraviolet light through the mask in the presence of oxygen is etched away, and the production process of etching away the silicon dioxide is also performed. As indicated in Table 5, the fluorine reactive ion etch will etch silicon dioxide at a rate 30 times as great as it will etch PDPP. The PDPP is removed and selected material is implanted into the silicon wafer through the patterned silicon dioxide substrate. This process of substrate layering, patterning, and performing production processes is repeated as required to fabricate each circuit device, as well known in the art with conventional chemistries. Both silicon and silicon oxide can be selectively patterned with the PDPP and GLPDPP as shown in Table 5. Finally, interconnection of the individual circuit devices can be done with a metal, usually aluminum. Patterning of the aluminum can also be done with the PDPP/GLPDPP process. A layer of silicon nitride is placed over the top of the fabricated device for protection. The PDPP/GLPDPP process is also used to pattern the silicon nitride to expose the aluminum pads for external circuit connections. The described fabrication process is typical whether the device is a simple discrete transistor, a microprocessor, dynamic random access memory device, or the driver transistors for a liquid crystal display. In general alternating layers, or substrates, of semiconductors, insulators and conductors are deposited and patterned to form the required solid-state device.

TABLE 5

Selective Etching for Pattern Transfers Using PDPP and GLPDPP Masks

| Material Etched | Mask Material Not Etched | Etch Selectivity (Material Etched:Mask Material Not Etched) | Etching Process |
| --- | --- | --- | --- |
| SiO$_2$ | PDPP | >30:1 | Fluorine Reactive Ion |
| SiO$_2$ | PDPP | >30:1 | 10:1 Buffered Oxide |
| Si | PDPP | >50:1 | Fluorine Reactive Ion |
| HgCdTe | GLPDPP | 10:1 | Ar/H/CH$_4$ Electron Cyclotron Resonant |

Prior art for plasma-deposited photosensitive films from single component reactants teaches that such films are only sensitive in the deep ultraviolet end of the spectrum. While this is ideal for high resolution device geometries, that is, under 0.5 µm, there is significant potential application for photoresists and selective wetting materials that are sensitive at longer wavelengths. These resists would require less expensive lithographic exposure tools. Furthermore, the ability to alter the level of photosensitivity of a resist is desirable for increased processing latitude. Alterable photosensitivity is also desirable for applications requiring photosensitivity further into the visible spectrum, or out of the visible spectrum for higher resolution pattern replication.

A single three-inch silicon wafer was prepared by the above monosilane/ethylene or toluene film depositions to determine PDPP and GLPDPP stoichiometry. The wafer was quartered. One quarter was exposed to 621 mj/sq-cm with light at 365 nm wavelength; one quarter was exposed to 621 mj/sq-cm with light at 254 nm wavelength.

An elemental analysis was performed on portions of the two exposed samples and one of the unexposed samples. The results are shown in Table 6, which indicates a 1:7 atom ratio of silicon to carbon for the unexposed photosensitive film.

TABLE 6

Elemental Analysis for Unexposed and Exposed Samples

| Sample Type | Carbon (%) | Oxygen (%) | Fluorine (%) | Silicon (%) |
| --- | --- | --- | --- | --- |
| Unexposed | 77 | 10 | 2.3 | 11 |
| Exposed to light at 365 nm wavelength | 74 | 16 | 0 | 9.7 |
| Exposed to light at 254 nm wavelength | 67 | 22 | 2.2 | 9.2 |

Portions of both exposed pieces, and one of the quartered unexposed pieces, were submitted to Electron Spectroscopy for Chemical Analysis (ESCA). The ESCA analysis of the binding energies for the exposed and unexposed samples provided the results indicated in Tables 7A, 7B and 7C.

TABLE 7A

ESCA Binding Energy Data for Unexposed PDPP Samples

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Unexposed (Atom Percent) | 71 | 3.9 | 0.0 | 2.0 | 10 | 2.3 | 5.8 | 5.2 | 0.0 |

TABLE 7B

ESCA Binding Energy Data for Exposed PDPP Samples at 365 nm

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Exposed to light at 365 nm wavelength (Atom Percent) | 68 | 4.9 | 0.0 | 1.2 | 16 | 0.0 | 3.1 | 6.6 | 0.0 |

TABLE 7C

ESCA Binding Energy Data for Exposed PDPP Samples at 254 nm

| Peak Assignments | C—R | C—OR | O=C—OR | C→C* | C=O,Si-O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Exposed to light at 254 nm wavelength (Atom Percent) | 56 | 8.6 | 1.6 | 0.6 | 22 | 2.2 | 0.0 | 3.7 | 5.5 |

The bonding information is drawn from high resolution scans of the elemental data and was used to examine the nature of the oxygen bonding as well. Atomic percentages are calculated for the included elements and do not include hydrogen, of which a considerable amount is expected to be present. The ESCA analysis represents approximately 100 Å of the surface of the material.

The ESCA analysis indicates photo-oxidation with light at 254 nm wavelength by increased binding of oxygen at that wavelength when compared to the unexposed sample. The analysis also shows photo-oxidation with light at 365 nm wavelength not as prominent as that with light at 254 nm wavelength. As expected, the incorporation of bound oxygen into the exposed films causes a proportionate reduction in the amount of carbon and silicon present. The binding energy data, from the high resolution scans, provides more insight into the photoreaction at the two frequencies. Peaks which show little significance or are felt to be attributable to contamination include the 689.6 eV bonds. However, significant trends did develop for the other represented bonds. Significantly, C—C, C—C*, C—H, Si—C, and Si—H bonds showed decreases with exposure. Furthermore, C—OC, C—OH, C=O, Si—O bonds showed consistent increases with exposure to light at 365 and 254 nm wavelengths. It is also noted that with the exposure to light at 254 nm wavelength, all of the silicon present was bonded to oxygen in some form with no remaining Si—C or Si—H bonds present. The 288.4 eV bond assigned to O=C—OC and O=C—OH are also present with the material exposed to light at 254 nm wavelength, but not at 365 nm wavelength.

The binding energies assigned to C—R and R—Si are the correct energies to be predominantly hydrogen bonds. Therefore, substantially no Si—C bonding is apparent from the analysis for either the unexposed or exposed states. The lack of substantial silicon to carbon bonding is indicative of a film that is not a copolymer of silicon and a hydrocarbon but comprises (Si—H) and (Si—Si) low molecular weight fragments interstitially situated within a substantially organic polymer matrix that does not contain an appreciable amount of silicon and does not exhibit highly photosensitive behavior.

Not only is little or no Si—C bonding present, but etch characteristics indicate that the predominant driver of post exposure characteristics is the oxides of silicon formed and not any incidental oxidation of carbon and hydrogen.

Satisfactory photoreactivity was demonstrated with light at 254 nm and 365 nm wavelengths. Subsequent etching in a buffered oxide etch exhibited satisfactory selective etching for samples exposed to both wavelengths.

The exposed, photo-oxidized areas (GLPDPP) of a film of the present invention easily wet with a liquid whereas the non-photo-oxidized areas of a film do not. It is believed that the surface tension of the non-photo-oxidized areas of the film is such that it does not permit a liquid to wet and adhere to these non-photo-oxidized areas or regions. Any liquid, that is a non-solid and non-gaseous viscous fluid, with suitable physical properties (e.g. the liquid could not be at a temperature above the melting point of the photosensitive film) should be capable of being used with a film of the present invention in a selective wetting application. Non-limiting examples of suitable liquid wetting agents are buffered oxide etches described above and metal solutions as described below.

This process of selective GLPDPP wetting is used to selectively deposit materials with wet chemistry on the film. The exposed photo-oxidized areas will wet and allow the selective deposition, typically a metal, such as silver or copper in a liquid solution, while the unexposed non-photo-oxidized areas can later be removed with, for example, either an organic solvent or a dry etchant with or without photoexposure. For example, a chlorine plasma will remove the unexposed area without the need for an exposure step. Homogeneous chemical reduction can be used to deposit a thin metal film, for example, a thin film of silver, copper, nickel, gold and lead sulfide. A solution of metal ions is mixed with reducing agents to reduce the ions to metal in a homogeneous plating bath. In a typical case, silver would be in an ammoniacal solution of silver nitrate. The silver metal is subsequently precipitated by the addition of a reducing agent. Sugar, Rochelle's salt (sodium potassium tartrate), or formaldehyde is commonly used as the reducing agent. Similar techniques have also been used to deposit copper, platinum, and lead sulfide. The contacting of a film of the present invention, with a photo-oxidized pattern of GLPDPP regions or areas and non-photo-oxidized PDPP regions or areas, for example, by immersion into this metal solution results in selective wetting of the photo-oxidized GLPDPP areas and the metal adhering only to the GLPDPP areas.

A selective wetting film of the present invention can be used to fabricate a printed circuit board. A layer of PDPP film of the present invention is formed from a plasma reaction on a suitable substrate from a silicon donor and an organic precursor as described above. A mask is produced to delineate the desired printed circuit pattern for the circuit board. The mask is fabricated to allow for the transmission of radiated electromagnetic energy in selected regions that will form the printed circuit on the board. The mask is placed over the layer of PDPP film and radiated electromagnetic energy, such as UV light as described above, is applied to these selected regions through the mask to photo-oxidize these regions and form the GLPDPP. The processed layer of PDPP film, which now consists of selected regions of GLPDPP and non-photo-oxidized PDPP film is placed in contact with a liquid form of the electrically conductive material that will be used to form the printed circuit, such as a liquid plating solution of silver as described above. The liquid will selectively wet and adhere to the GLPDPP regions and will not adhere to the non-photo-oxidized regions of the PDPP film. The dried liquid adhering to the photo-oxidized GLPDPP form the printed circuit paths on the circuit boards.

This selective wetting process will allow a much finer geometry of the printed circuit over the conventional process, as well as a more cost effective additive process, rather than the costly process of blanket depositing of the electrically conductive material, and then removing by etching away the unwanted material. Since the conductive metal circuit trace that dried over the GLPDPP must be supported on an electrical insulator, the remaining GLPDPP under the metal serves as an excellent substrate electrical insulator. The non-photo-oxidized regions of the PDPP film can remain to form an electrically insulating layer over the base substrate. Alternatively, the non-photo-oxidized regions of the PDPP film may be removed by a suitable method, such as etching away the non-photo-oxidized regions as described above, or the base substrate may be removed so that the layer of PDPP film, with non-photo-oxidized regions and photo-oxidized regions, serves as the circuit board.

The disclosed process of printed circuit board fabrication can be applied to boards with single-sided patterns, double-sided patterns, and multi-layer printed wiring applications.

A selective wetting film of the present invention can be used to fabricate a photomask having selective light transparent regions and non-light transparent regions through which integrated circuit images are optically transferred onto a semiconductor wafer. A layer of PDPP film of the present invention is formed from a plasma reaction on an optically transparent substrate, such as glass or quartz, from a silicon donor and an organic precursor as described above. A mask is produced to delineate the desired pattern for the integrated circuit images that will be transferred to the wafer. The mask is fabricated to allow for the transmission of radiated electromagnetic energy to the regions that will be non-light transparent in the photomask. The mask is placed over the layer of PDPP film and radiated electromagnetic energy, such as UV light as described above, is applied to these selected regions through the mask to photo-oxidize these regions and form the GLPDPP. The processed layer of PDPP film, which now consists of selected regions of GLPDPP and non-photo-oxidized PDPP film is placed in contact with a liquid, for example, a metal plating solution as described above, or any liquid that will dry to a non-light transparent material. The liquid will selectively wet, adhere to, and dry over the GLPDPP regions and will not adhere to the non-photo-oxidized regions of the PDPP film. The non-photo-oxidized PDPP regions of the film can be etched away by using one of the etching processes described above to complete fabrication of the photomask by forming the selective light transparent regions of the photomask.

As described above, selective wetting of photo-oxidized regions of the films in the present invention with a buffered oxide etch were used to etch away photo-oxidized regions of the films.

In this disclosure, there is described preferred embodiments of the invention, it is to be understood that the invention is capable of use in other combinations and enviornments and is capable of changes or modifications within the scope of the inventive concept as expressed herein. Therefore, the present invention should not be limited to any single embodiment, but rather construed in breadth and scope in accordance with the recitation of the appended claims.

The invention claimed is:

1. A process for selectively wetting a film on a substrate, the process comprising the steps of:
   forming the film on the substrate from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor;

patterning the film with a radiated electromagnetic energy through a mask in the presence of oxygen to produce a one or more photo-oxidized regions from exposure to the radiated electromagnetic energy through the mask; and contacting the film with a liquid, whereby the liquid selectively wets and adheres to the one or more photo-oxidized regions.

2. The process of claim 1 wherein the liquid is an electrically conductive material.

3. The process of claim 2 further comprising the step of drying the electrically conductive material adhering to the one or more photo-oxidized regions to form a printed circuit.

4. The process of claim 2 wherein the electrically conductive material is a solution of metal ions and reducing agents.

5. The process of claim 4 wherein the metal ions are silver ions.

6. The process of claim 1 wherein the liquid is a buffered oxide etch.

7. The process of claim 1 wherein the second component of the two-component plasma reaction is selected from the group consisting of ethylene, methane, ethane and toluene.

8. The process of claim 1 wherein the first component of the two-component plasma reaction is selected from the group consisting of monosilane, disilane and dichlorosilane.

9. The process of claim 3 wherein the second component of the two-component plasma reaction is selected from the group consisting of ethylene, methane, ethane and toluene.

10. The process of claim 3 wherein the first component of the two-component plasma reaction is selected from the group consisting of monosilane, disilane and dichlorosilane.

11. A process for forming a photomask comprising the steps of:

forming a film on an optically transparent substrate from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor;

patterning the film with a radiated electromagnetic energy through a mask in the presence of oxygen to produce a one or more photo-oxidized regions from exposure to the radiated electromagnetic energy through the mask;

contacting the film with a non-transparent liquid, whereby the non-transparent liquid selectively wets and adheres to the one or more photo-oxidized regions;

drying the non-transparent liquid adhering to the one or more photo-oxidized regions to produce a one or more non-transparent regions on the film; and etching away the film in regions not included in the one or more non-transparent regions to form the photomask.

12. The process of claim 11 wherein the second component of the two-component plasma reaction is selected from the group consisting of alkanes, alkenes, alkynes, phenyls and aromatic hydrocarbons.

13. The process of claim 11 wherein the second component of the two-component plasma reaction is selected from the group consisting of ethylene, methane, ethane and toluene.

14. The process of claim 11 wherein the first component is selected from the group consisting of monosilane, disilane and dichlorosilane.

15. The process of claim 14 wherein the second component is selected from the group consisting of ethylene, methane, ethane and toluene.

16. The process of claim 11 wherein the non-transparent liquid is a metal plating solution.

17. A process for selectively wetting a photosensitive film on a substrate, the process comprising the steps of:

forming the photosensitive film on the substrate from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor; the photosensitive film comprising photosensitive (Si—H) and (Si—Si) fragments situated in a non-silicon containing and non-photosensitive organic polymer matrix;

patterning the film with a radiated electromagnetic energy through a mask in the presence of oxygen to produce a one or more photo-oxidized regions from exposure to the radiated electromagnetic energy through the mask to form silicon oxides from oxidation of silicon in the (Si—H) and (Si—Si) fragments; and contacting the film with a liquid, whereby the liquid selectively wets and adheres to the one or more photo-oxidized regions.

18. The process of claim 17 wherein the second component of the two-component plasma reaction is selected from the group consisting of ethylene, methane, ethane and toluene.

19. The process of claim 17 wherein the first component of the two-component plasma reaction is selected from the group consisting of monosilane, disilane and dichlorosilane.

20. The process of claim 19 wherein the second component of the two-component plasma reaction is selected from the group consisting of ethylene, methane, ethane and toluene.

21. A process for selectively wetting a film on a substrate, the process comprising the steps of:

forming the film on the substrate from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor;

patterning the film with a radiated electromagnetic energy through a mask in the presence of oxygen to produce a one or more photo-oxidized regions from exposure to the radiated electromagnetic energy through the mask; and contacting the film with an electrically conductive liquid, whereby the electrically conductive liquid selectively wets and adheres to the one or more photo-oxidized regions.

22. The process of claim 21 further comprising the step of drying the electrically conductive liquid adhering to the one or more photo-oxidized regions to form a printed circuit.

23. The process of claim 21 wherein the electrically conductive liquid is a solution of metal ions and reducing agents.

24. The process of claim 23 wherein the metal ions are silver ions.

25. A process for forming a photomask comprising the steps of:

forming a film on an optically transparent substrate from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor;

patterning the film with a radiated electromagnetic energy through a mask in the presence of oxygen to produce a one or more photo-oxidized regions from exposure to the radiated electromagnetic energy through the mask;

contacting the film with a metal plating solution, whereby the metal plating solution selectively wets and adheres to the one or more photo-oxidized regions;

drying the metal plating solution adhering to the one or more photo-oxidized regions to produce a one or more metal plated regions on the film; and etching away the film in regions not included in the one or more metal plated regions to form the photomask.

* * * * *